(12) United States Patent
Chu

(10) Patent No.: US 7,606,105 B2
(45) Date of Patent: Oct. 20, 2009

(54) DEEP POWER DOWN MODE CONTROL CIRCUIT

(75) Inventor: Shin Ho Chu, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 132 days.

(21) Appl. No.: 11/811,863

(22) Filed: Jun. 11, 2007

(65) Prior Publication Data

US 2008/0123460 A1 May 29, 2008

(30) Foreign Application Priority Data

Nov. 24, 2006 (KR) .................. 10-2006-0117156

(51) Int. Cl.
*G11C 5/14* (2006.01)
(52) U.S. Cl. .................. 365/227; 365/226; 365/229
(58) Field of Classification Search .............. 365/227, 365/226, 229
See application file for complete search history.

(56) References Cited

U.S. PATENT DOCUMENTS

| | | | |
|---|---|---|---|
| 6,456,130 B1 * | 9/2002 | Schnell | 327/156 |
| 6,724,686 B2 * | 4/2004 | Ooishi et al. | 365/233.14 |
| 6,850,453 B2 * | 2/2005 | Park | 365/227 |
| 6,987,699 B2 * | 1/2006 | Lee | 365/194 |
| 7,079,441 B1 * | 7/2006 | Partsch et al. | 365/226 |
| 7,082,074 B2 | 7/2006 | Horiguchi et al. | |
| 7,184,354 B2 | 2/2007 | Song | |
| 7,372,746 B2 * | 5/2008 | Kim | 365/189.06 |
| 7,420,873 B2 * | 9/2008 | Jang | 365/233.1 |
| 7,463,081 B2 * | 12/2008 | Jin | 327/540 |
| 2008/0272812 A1 * | 11/2008 | Cho | 327/158 |

* cited by examiner

*Primary Examiner*—Tuan T Nguyen
*Assistant Examiner*—Hien N Nguyen
(74) *Attorney, Agent, or Firm*—John P. White; Cooper & Dunham LLP

(57) ABSTRACT

A deep power down mode control circuit is provided. The deep power down mode control circuit includes a deep power down signal generator for outputting a deep power down signal in response to a burst command signal and a clock enable signal, and a deep power down delay controller for delaying the deep power down signal for a predetermined delay time, and outputting the delayed signal.

11 Claims, 5 Drawing Sheets

DEEP POWER DOWN MODE CONTROL CIRCUIT

BACKGROUND

The present disclosure relates to a semiconductor memory device, and more particularly to a deep power down mode control circuit.

Generally, when a semiconductor device is in an active state, peripheral circuits thereof operate to store data or to externally output stored data. On the other hand, in a standby state of the semiconductor device, unnecessary ones of the peripheral circuits are disabled to minimize power consumption.

In particular, mobile semiconductor memory devices use a deep power down mode for further reduction of power consumption in a standby state. The deep power down mode is adapted to further reduce current consumption, as compared to a power down mode. In the deep power down mode, an operation for internally switching off supply of power is basically carried out in spite of an application of a DRAM voltage.

That is, when a semiconductor memory device is in a standby mode for a prolonged period of time, it enters a deep power down mode, to stop operations of peripheral circuits, and thus, to reduce unnecessary power consumption occurring in the standby mode.

The deep power down mode is controlled in the semiconductor memory device in accordance with an external command.

That is, the semiconductor memory device enters or exits the deep power down mode in synchronism with a clock signal in accordance with the states of signals input to the semiconductor memory device via external signal pins, for example, a burst command and a clock enable signal.

For example, when the burst command signal is a stop signal, and the clock enable signal has a low level, the semiconductor memory device enters the deep power down mode in synchronism with a clock signal. When the clock enable signal transits to a high level, the semiconductor memory device exits the deep power down mode.

When the semiconductor memory device enters the deep power down mode, it is controlled in such a manner that supply of power to certain circuits of a power supply circuit is cut off, in order to reduce current consumption.

Referring to FIG. 1, a conventional deep power down control circuit is illustrated. The conventional deep power down control circuit includes a deep power down (DPD) signal generator 100, an internal voltage generator 200, an internal peripheral circuit controller 300, and a power up signal generator 400.

In such a conventional deep power down control circuit, however, the time when the semiconductor memory device enters the deep power down mode is not set. In the conventional case, only the time for internal voltage stabilization and circuit initialization, for example, 200 μm, is given, as shown in FIG. 2.

For this reason, there may be a problem in terms of an initialization of internal circuits when the period of time from the point of time when the semiconductor memory device enters the deep power down mode to the point of time when the semiconductor memory device exits the deep power down mode is very short.

BRIEF SUMMARY

In one aspect of the present disclosure, a deep power down mode control circuit comprises a deep power down signal generator for outputting a deep power down signal in response to a burst command signal and a clock enable signal, and a deep power down delay controller for delaying the deep power down signal for a predetermined delay time, and outputting the delayed signal.

The deep power down delay controller may determine an activation time of the deep power down signal in response to the delayed signal output from the deep power down delay controller.

The deep power down delay controller may output an active signal, as the deep power down signal, until the predetermined delay time elapses, when the predetermined delay time is longer than a deep power down mode time from a point of time when the deep power down mode is begun to a point of time when the deep power down mode is terminated.

In another aspect of the present disclosure, a deep power down mode control circuit comprises a deep power down signal generator for outputting a deep power down signal in response to a burst command signal and a clock enable signal, and a deep power down delay controller connected to an output of the deep power down signal generator, and configured to determine an activation time, based on the deep power down signal.

The deep power down delay controller may delay the deep power down signal input to the deep power down delay controller for a predetermined delay time, may output the delayed signal, and may determine an activation time of the deep power down signal in response to the delayed signal.

The deep power down delay controller may output an active signal, as the deep power down signal, until the predetermined delay time elapses, when the predetermined delay time is longer than a deep power down mode time from a point of time when the deep power down mode is begun to a point of time when the deep power down mode is terminated.

BRIEF DESCRIPTION OF THE DRAWINGS

The above and other features of the subject matter of the present disclosure will be more clearly understood from the following detailed description taken in conjunction with the accompanying drawings, in which.

DETAILED DESCRIPTION OF EXEMPLARY EMBODIMENTS

Preferred embodiments of the present disclosure will now be described in detail with reference to the accompanying drawings.

In accordance with an exemplary embodiment of the present disclosure, a deep power down mode control circuit for a semiconductor device is provided in which a deep power down mode is controlled using an internal delay time set by a time taken for an internal voltage to be stabilized after completion of the deep power down mode, in order to sufficiently compensate for the time required for initialization of an internal circuit without causing a reduction in the speed of the semiconductor device. That is, the semiconductor device can operate stably in accordance with a sufficient compensation for the time taken for an initialization for internal circuits even when the deep power down mode time is short.

Figure 1:
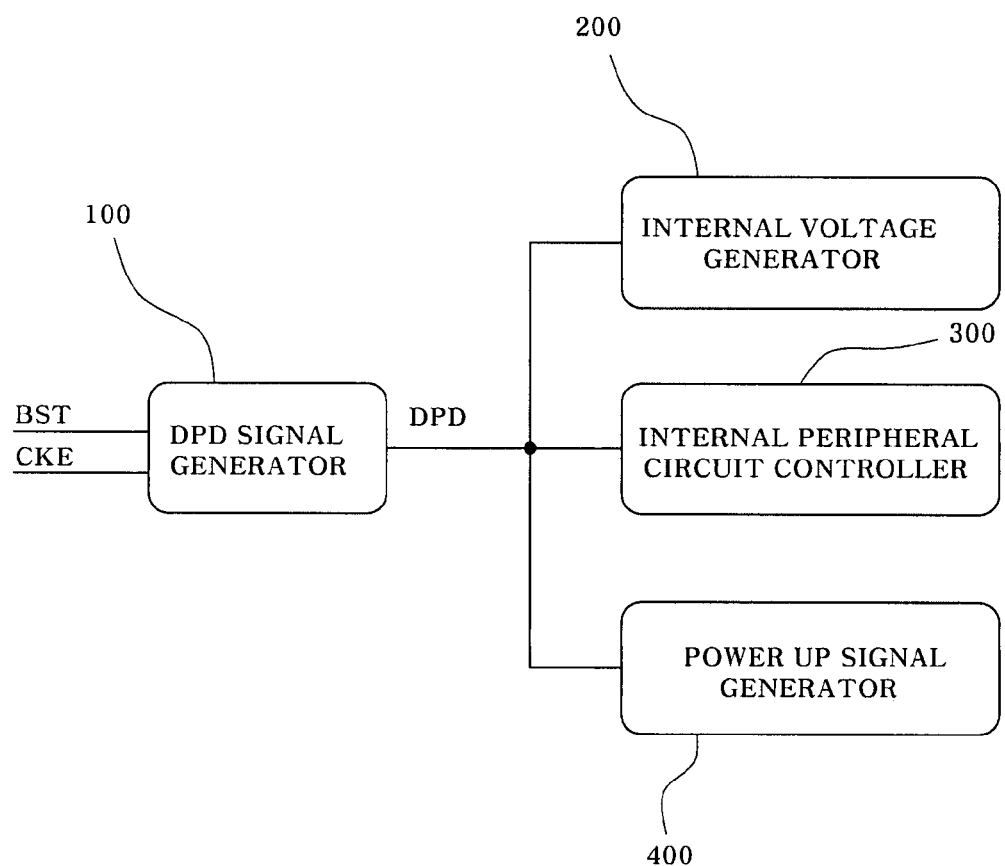
FIG. 1 is a block diagram illustrating a conventional deep power down control circuit.
Figure 2:
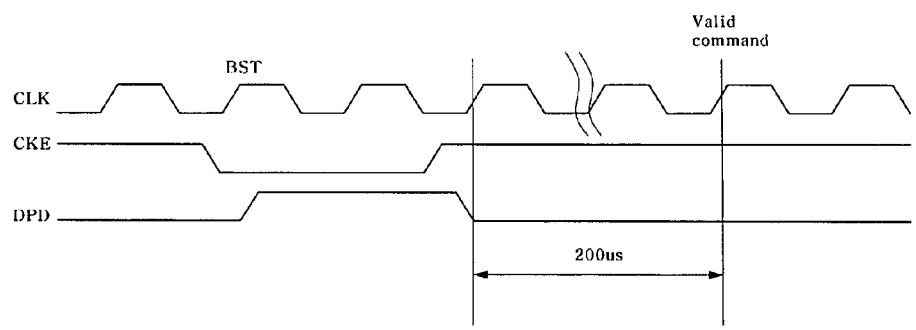
FIG. 2 is a timing diagram of signals in the conventional deep power down control circuit shown in FIG. 1.
Figure 3:
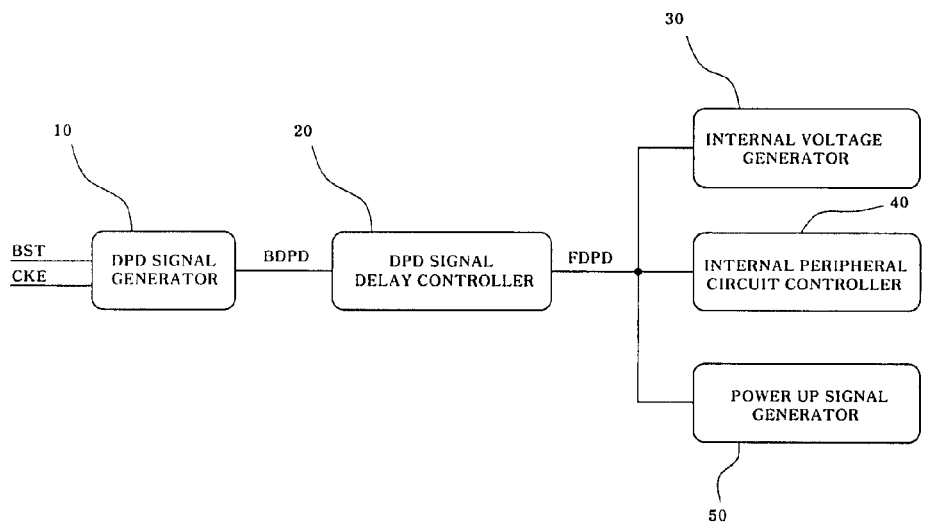
FIG. 3 is a block diagram of a deep power down mode control circuit, according to an exemplary embodiment of the present disclosure.
Figure 4:
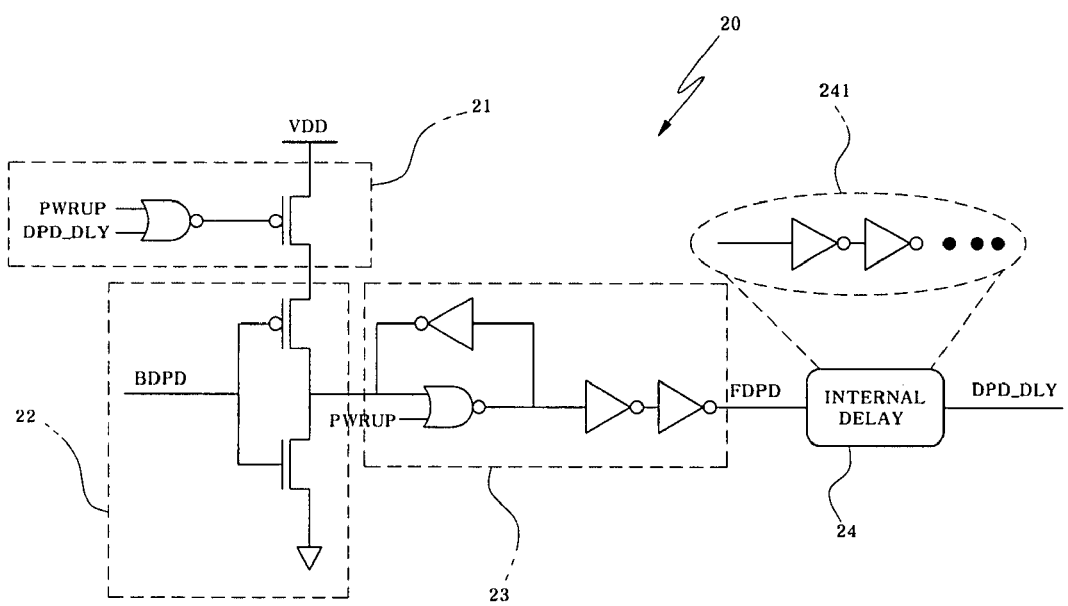
FIG. 4 is a circuit diagram of a deep power down mode signal delay circuit shown in FIG. 3, according to an exemplary embodiment of the present disclosure.

FIG. 3 is a block diagram of a deep power down mode control circuit of a semiconductor memory device according to an exemplary embodiment of the present disclosure. FIG. 4 is a circuit diagram of a deep power down mode signal delay circuit shown in FIG. 3, according to an exemplary embodiment of the present disclosure.

As shown in FIG. 3, a deep power down mode control circuit according to an exemplary embodiment of the present disclosure includes a deep power down (DPD) signal generator 10 for generating a DPD signal BDPD in response to a burst command signal BST and a clock enable signal CKE, and a DPD signal delay controller 20 for delaying the DPD signal BDPD for a predetermined delay time, and outputting the delayed signal.

As shown in FIG. 4, the DPD signal delay controller 20 includes an inverter 22 for inverting the DPD signal BDPD, and outputting the inverted signal, and a switch 21 for NORing a power up signal PWRUP and a delayed DPD signal DPD_DLY, and outputting a supply voltage VDD in response to a signal generated in accordance with the NORing operation. The DPD signal delay controller 20 also includes a latch 23 for NORing the output signal from the inverter 22 and the power up signal PWRUP, latching a signal generated in accordance with the NORing operation, and outputting the latched signal, namely, a signal FDPD, and an internal delay 24 for delaying the output signal from the latch 23 for a predetermined internal delay time, and outputting the delayed signal to the switch 21.

The signal FDPD output from the latch 23 is applied to an internal circuit of the semiconductor memory device. The internal circuit includes an internal voltage generator 30, an internal peripheral circuit controller 40, and a power up signal generator 50.

The internal delay 24 includes an inverter chain 241 consisting of a plurality of inverters.

While the above-mentioned embodiment practices by making the DPD signal generator input the BSK and the CKE, the present invention will be able to apply even in the case such a circuit constitution uses other signals.

Hereinafter, operation of the deep power down mode control circuit having the above-described configuration according to an example of the present disclosure will be described.

Figure 5:
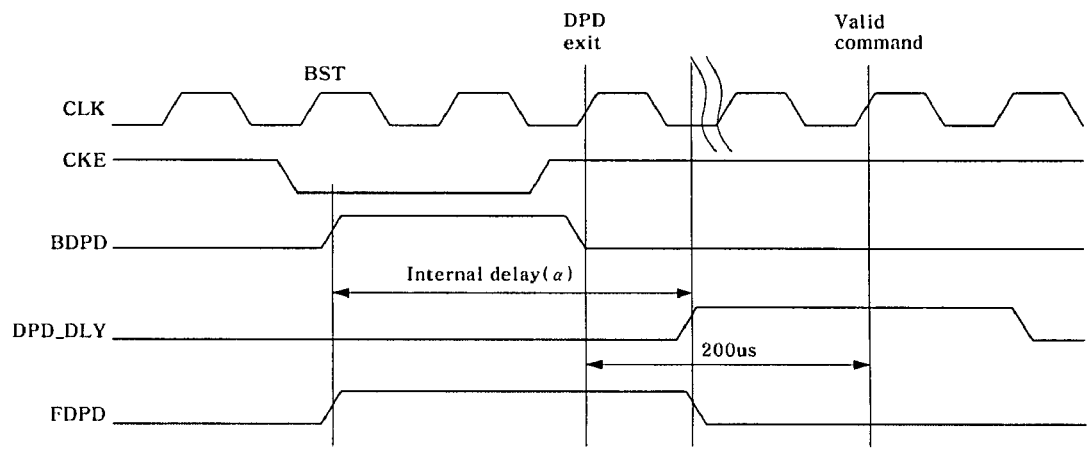
FIG. 5 is a timing diagram of signals in a case of a deep power down mode time shorter than an internal delay time, in accordance with an example of the present disclosure.
Figure 6:
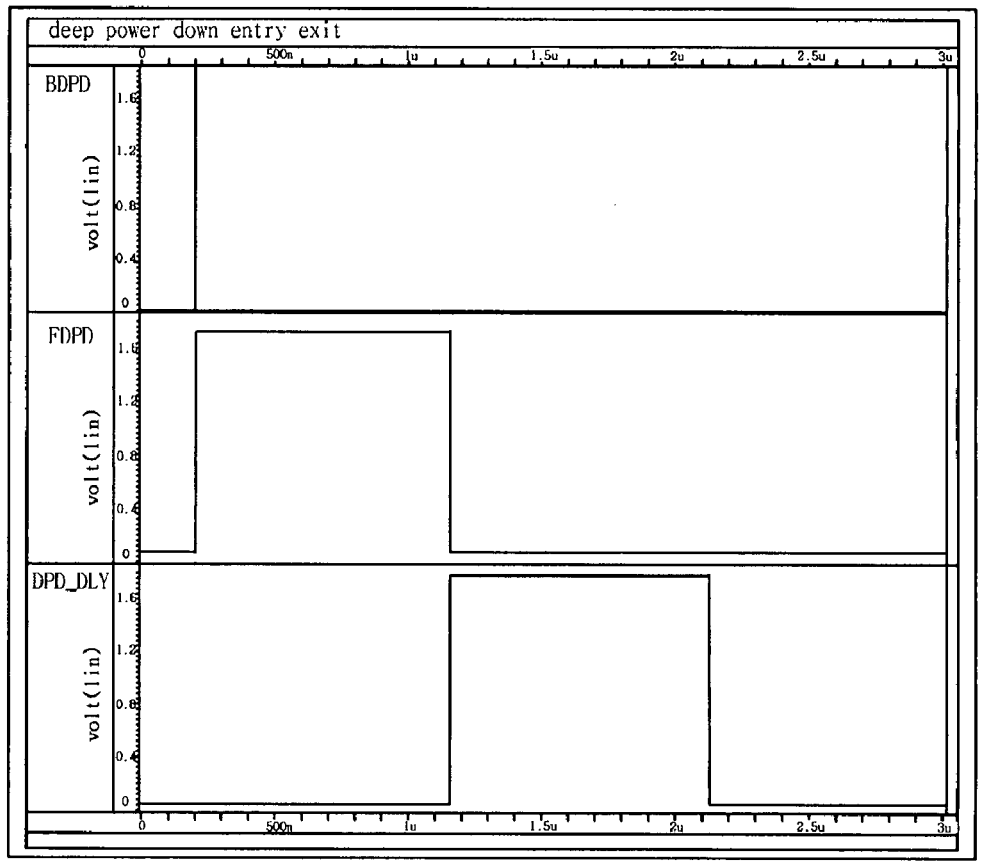
FIG. 6 is a diagram illustrating simulation results for a case of a deep power down mode time shorter than an internal delay time, in accordance with an example of the present disclosure.
Figure 7:
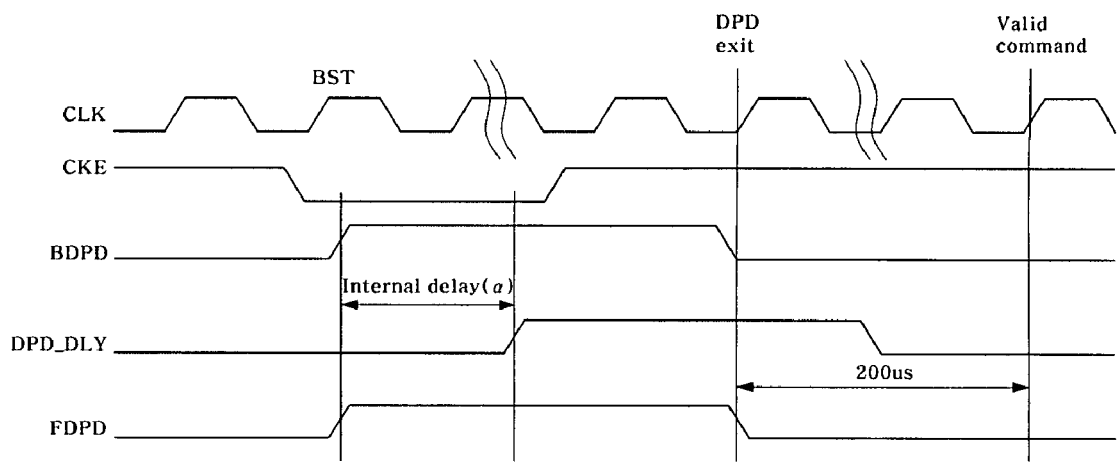
FIG. 7 is a timing diagram of signals in a case of a deep power down mode time longer than an internal delay time, in accordance with an example of the present disclosure.
Figure 8:
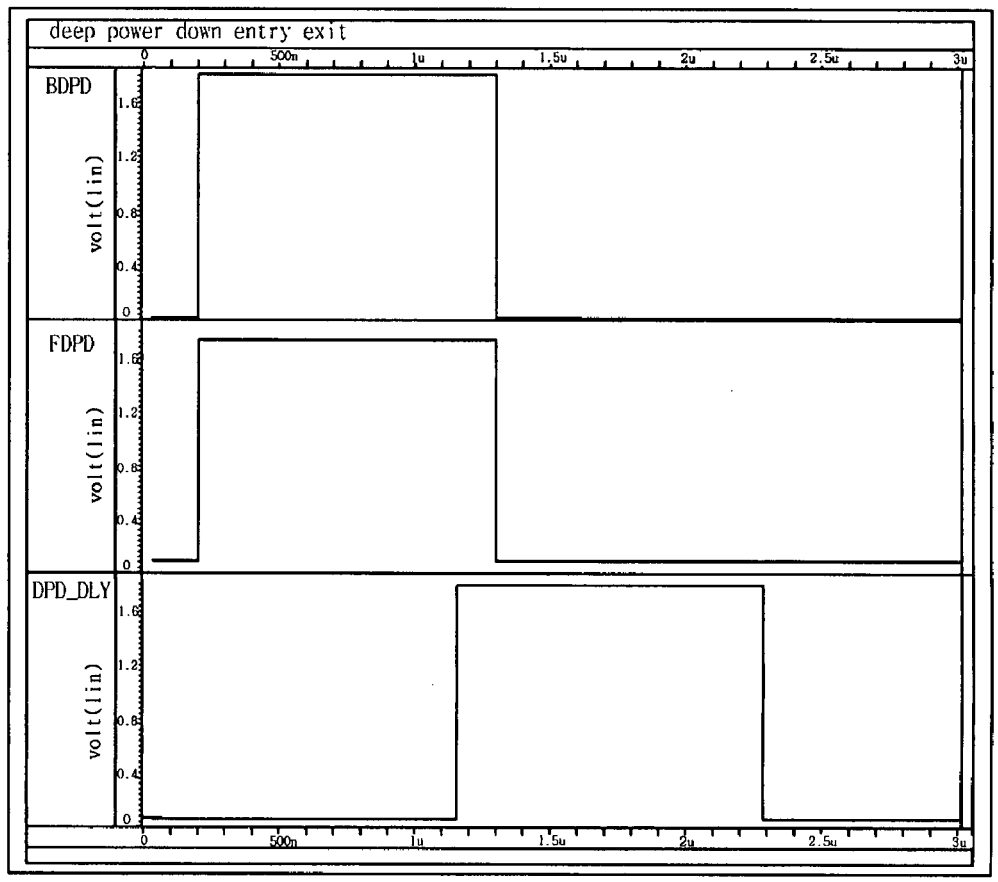
FIG. 8 is a diagram illustrating simulation results for a case of a deep power down mode time longer than an internal delay time, in accordance with an example of the present disclosure.

FIG. 5 is a timing diagram of signals in a case of a deep power down mode time shorter than an internal delay time in accordance with an example of the present disclosure. FIG. 6 is a diagram illustrating simulation results for a case of a deep power down mode time shorter than an internal delay time, in accordance with an example of the present disclosure. FIG. 7 is a timing diagram of signals in a case of a deep power down mode time longer than an internal delay time, in accordance with an example of the present disclosure. FIG. 8 is a diagram illustrating simulation results for a case of a deep power down mode time longer than an internal delay time, in accordance with an example of the present disclosure.

First, the DPD signal generator 10 outputs a signal enabling entrance of a deep power down mode, namely, a signal FDPD, in synchronism with a clock signal, when the burst command signal is a stop signal, and the clock enable signal CKE has a low level.

When the deep power down (DPD) mode is activated, the DPD signal delay controller 20 inverts the DPD signal BDPD to a low-level signal through the inverter 22.

The latch 23 performs a NORing operation to the low-level signal output from the inverter 22 and a power up signal PWRUP, thereby outputting a signal FDPD. Since the power up signal PWRUP has a low level in the DPD mode, the signal FDPD output from the latch 23 has a high level.

The internal delay 24, which includes the inverter chain 241, delays the signal FDPD output from the latch 23 for a predetermined internal delay time, and outputs a delayed DPD signal DPD_DLY having a high level to the switch 21.

The switch 21 is then turned on in response to a signal generated in accordance with a NORing operation to the delayed DPD signal DPD_DLY and power up signal PWRUP. In the ON state, the switch 21 supplies the supply voltage VDD to the inverter 22.

When the DPD mode is subsequently deactivated, the DPD signal generator 10 outputs a low-level signal, as the DPD signal BDPD, in response to the burst command signal BST and clock enable signal CKE.

The DPD signal delay controller 20 inverts the DPD signal BDPD to a high-level signal through the inverter 22, and outputs the high-level signal.

The latch 23 performs a NoRing operation to the high-level signal output from the inverter 22 and the power up signal PWRUP, thereby outputting a low-level signal as the signal FDPD.

The internal delay 24 delays the signal FDPD output from the latch 23 for the predetermined internal delay time, and outputs a low-level signal to the switch 21, as the delayed DPD signal DPD_DLY.

The switch 21 is then turned on in response to a signal generated in accordance with a NORing operation to the delayed DPD signal DPD_DLY, which has a low level, and the power up signal PWRUP. Accordingly, the switch 21 supplies the supply voltage VDD to the inverter 22.

When the DPD mode time, namely, the time interval between the point of time when the semiconductor memory device enters the DPD mode and the point of time when the semiconductor memory device exits the DPD mode, is shorter than the DPD delay time, as shown in FIGS. 5 and 6, the DPD signal BDPD is transited to a low level before the DPD delay signal DPD_DLY transits to a high level.

In this case, accordingly, the switch 21 is turned off in response to a signal generated in accordance with a NORing operation to a low-level signal as the delayed DPD signal DPD_DLY and a low-level signal as the power up signal PWRUP. Accordingly, the switch 21 does not supply the supply voltage VDD to the inverter 22.

That is, when the DPD mode time (the high-level period of the DPD signal BDPD) is shorter than the DPD delay time (the internal delay period), as shown in FIGS. 5 and 6, the internal DPD signal FDPD is maintained in an active state until the internal delay time elapses.

On the other hand, when the DPD mode time is longer than the DPD delay time, as shown in FIGS. 7 and 8, the internal DPD signal FDPD is maintained in an active state until the DPD mode time elapses, because the DPD signal BDPD is maintained in a high-level state even after the transition of the DPD delay signal DPD_DLY to a high level.

Thus, in accordance with the present disclosure, it is possible to sufficiently secure the time required for an initialization of internal circuits even when the DPD mode time is short, because the DPD mode is maintained for at least the predetermined internal delay time, irrespective of the DPD mode time.

Although preferred embodiments of the disclosure have been disclosed for illustrative purposes, those skilled in the art will appreciate that various modifications, additions and substitutions are possible, without departing from the scope and spirit of the disclosure as disclosed in the accompanying claims. For example, elements and/or features of different examples and illustrative embodiments may be combined with each other and/or substituted for each other within the scope of this disclosure and appended claims.

The present application claims priority to Korean patent application number 10-2006-0117156, filed Nov. 24, 2006, the entire contents of which are incorporated by reference herein.

What is claimed is:

1. A deep power down mode control circuit comprising:
   a deep power down signal generator configured to output a first deep power down signal in response to a burst command signal and a clock enable signal; and
   a deep power down delay controller configured to receive the first deep power down signal and generate a second deep power down signal, wherein the second deep power down signal is enabled to activate a deep power down mode and an enable period of the second deep power down signal is larger than an enable period of the first deep power down signal.

2. The deep power down mode control circuit according to claim 1, wherein the second deep power down signal is enabled when the first deep power down signal is enabled.

3. The deep power down mode control circuit according to claim 1, wherein the second deep power down signal is disabled after a predetermined period elapses from a period that the first deep power down signal is disabled.

4. The deep power down mode control circuit according to claim 1, wherein the deep power down delay controller comprises:
   an inverter configured to drive an output node in response to the first deep power down signal;
   a latch configured to latch a signal outputted from the output node in response to the power up signal, and output the second deep power down signal;
   an internal delay configured to delay the second deep power down signal for a predetermined period and output a deep power down delay signal; and
   a switch configured to control a driving of the inverter in response to the power up signal and the deep power down delay signal.

5. The deep power down mode control circuit according to claim 4, wherein the inverter pulls down the output node when the first deep power down signal is enabled.

6. The deep power down mode control circuit according to claim 4, wherein the inverter pulls up the output node after the predetermined period of the internal delay elapses from a period that the second deep power down signal is disabled.

7. A deep power down mode control circuit comprising:
   an inverter configured to drive an output node in response to a first deep power down signal;
   a latch configured to latch a signal outputted from the output node in response to the power up signal, and output a second deep power down signal;
   an internal delay configured to delay the second deep power down signal for a predetermined period and output a deep power down delay signal; and
   a switch configured to control a driving of the inverter in response to the power up signal and the deep power down delay signal.

8. The deep power down mode control circuit according to claim 7, wherein the inverter pulls down the output node when the first deep power down signal is enabled.

9. The deep power down mode control circuit according to claim 7, wherein the inverter pulls up the output node after the predetermined period of the internal delay elapses from a period that the second deep power down signal is disabled.

10. The deep power down mode control circuit according to claim 7, wherein the second deep power down signal is applied to an internal circuit of a semiconductor memory device.

11. The deep power down mode control circuit according to claim 7, wherein the internal delay comprises an inverter chain.

* * * * *